United States Patent [19]

Seidel

[11] 4,095,196
[45] June 13, 1978

[54] ARC-COSINE PHASE MODULATORS

[75] Inventor: Harold Seidel, Warren, N.J.

[73] Assignee: Bell Telephone Laboratories, Incorporated, Murray Hill, N.J.

[21] Appl. No.: 817,352

[22] Filed: Jul. 20, 1977

[51] Int. Cl.² ............................................. H03C 3/00
[52] U.S. Cl. .................................. 332/16 T; 307/262; 328/142
[58] Field of Search ...................... 332/16 R, 16 T, 17; 328/142, 143; 307/262

[56] References Cited

U.S. PATENT DOCUMENTS 3,777,275 12/1973 Cox .......................................... 330/10
3,798,573 3/1974 Seidel ................................... 332/16 R Primary Examiner—John Kominski
Attorney, Agent, or Firm—Henry T. Brendzel

[57] ABSTRACT

Arc-cosine phase modulation is achieved by transforming the baseband signal with a $\tanh^{-1}$ transformation function, by modulating a carrier signal with a quadrature sum of two exponential signals related to the inverse hyperbolic tangent signal, and by hard limiting and filtering the modulated signal.

10 Claims, 5 Drawing Figures

ARC-COSINE PHASE MODULATORS

BACKGROUND OF THE INVENTION

1. Field of the Invention

This invention relates to modulators.

2. Description of the Prior Art

Amplitude modulation is realized, most commonly, with circuits which control the amplitude of a carrier signal. Amplifier circuits responsive to such modulators require good linearity if distortions and intermodulation products are to be avoided, and this becomes increasingly difficult with increased desired amplifier efficiency and power output.

To combat the problems associated with conventional amplitude modulation followed by amplification, a number of artisans have developed different techniques for obtaining high power amplitude modulated signals.

L. R. Kahn, for example, in "Comparison of Linear Single-Sideband Transmitters with Envelope Elimination and Restoration Single-Side-Band Transmitters," *Proceedings of the IRE*, Dec. 1956, page 1706 et seq, describes a technique whereby the modulated signal is separated into a carrier signal and an envelope signal. The two signals are amplified separately and modulation is executed at the last stage, following the power amplification.

M. I. Jacobs in U.S. Pat. No. 3,248,663, issued Apr. 26, 1966, describes a method for realizing amplitude modulation by means of phase modulation. D. C. Cox in U.S. Pat. No. 3,777,275, issued Dec. 4, 1973, expanded on the teachings of Jacobs by describing an interferometric amplifier where amplitude modulation is obtained by means of equal and constant amplitude carrier signals that are phase modulated with equal but oppositely signed angles. Amplified replicas of the phase modulated constant amplitude signals are combined, or interfered, to form the amplitude modulated signal. The Cox approach permits the use of constant modulus amplifiers which need not be totally free of distortions. The phase modulation angles of Cox are related to the input signal through an arc-sin function, which is developed by Cox through feedback means.

In an interferometric amplifier described in my copending application filed on even date herewith, it is necessary to modulate the phase of a carrier signal with an angle whose cosine is related to an input signal. That is, it is necessary to develop the signals $\cos(\omega t + \phi)$ and $\cos(\omega t - \phi)$ where $\phi$ equals $\cos^{-1}[a(t)\cos \alpha t]$ and $a(t)\cos \alpha t$ is the baseband signal.

Higher frequency response is realized in my interferometric amplifier when the arc-cosine function is developed with minimum or no feedback.

SUMMARY OF THE INVENTION

Accordingly, it is an object of this invention to provide a simple circuit for developing phase modulation with an arc-cosine function.

Another object of this invention is to provide an arc-cosine function phase modulator capable of high frequency operation.

These and other objects and advantages are realized with a circuit where the arc-cosine modulation is realized in three steps. In the first step, an inverse hyperbolic tangent function is realized; in the second step, a quadrature processing circuit develops a carrier modulated quadrature sum of two exponential signals related to the inverse hyperbolic tangent signal; and in the third step, the output signal of the quadrature hybrid is hard limited and filtered to obtain the desired arc-cosine phase modulation.

A clearer understanding of this invention may be had by studying the detailed description appended hereto in conjunction with the drawing where;

DETAILED DESCRIPTION

General Discussion

When signals B and $x$ are passed through a nonlinear circuit containing a quadrature hydrid which develops the signal $B[e^x + je^{-x}]$ (expressible in polar coordinates as $B\{|e^x + je^{-x}|\}e^{j\alpha}$ where $\alpha$ equals $\tan^{-1}[e^{-2x}]$), it is interesting to note that the output signal of the nonlinear circuit is shifted from input signal B by a phase angle whose tangent equals $e^{-2x}$. Squaring the output signal develops a squared signal having an amplitude term $\{|e^x + je^{-x}|\}^2 B^2$ and a phase term having an angle which is twice the angle of the squared output signal, to wit, $2\alpha$. That is, when signal B is made equal to $\cos \omega t$, the squared output signal of the nonlinear circuit, also called herein the quadrature processing circuit, neglecting the amplitude term, is $(\cos \omega t)e^{j2\alpha}$ or $\cos(\omega t + 2\alpha)$.

When $\alpha$ equals $\tan^{-1}[e^{-2x}]$, which is an angle in a right triangle formed by a side $e^x$, a side $e^{-x}$, and a hypotenuse $(e^{2x} + e^{-2x})^{1/2}$, with the aid of the trigonometric identity $$\cos 2\alpha = 1 - \sin^2 \alpha \qquad (1)$$

it can be shown that $$2\alpha = \cos^{-1}[(e^x - e^{-x})/(e^x + e^{-x})] \qquad (2)$$

or that $$2\alpha = \cos^{-1}[\tanh x]. \qquad (3)$$

So, the squared output signal of the quadrature hybrid, again neglecting the amplitude term, is $\cos[\omega t + \cos^{-1}(\tanh x)]$.

Since it is desired to develop the signal $\cos\{\omega t + \lambda \cos^{-1}[a(t)\cos \alpha t]\}$, the baseband signal $a(t)\cos \alpha t$ must be equated with the expression $\tanh x$, the amplitude modulation term $\{|e^x + je^{-x}|\}^2$ must be eliminated with appropriate hard limiting, and the limited signal must appropriately be filtered to save only the desired frequencies. Equating $a(t)\cos(\alpha t)$ with $\tanh(x)$ yields the equation $$x = \tanh^{-1}[a(t)\cos \alpha t]. \qquad (4)$$

IMPLEMENTATION

Figure 1:
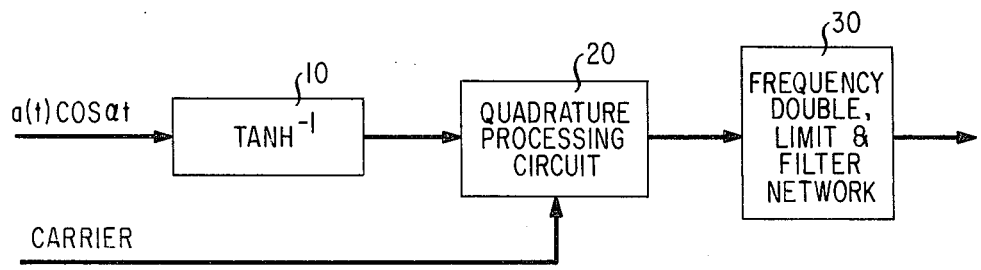
FIG. 1 is a block diagram of the arc-cosine phase modulator of this invention.

FIG. 1 depicts the block diagram of an arc-cosine modulator in accordance with the principles of this invention as described above. Therein, the input signal $a(t)\cos \alpha t$ is supplied to arc-tanh circuit 10 which develops a signal $x$ in accordance with Equation (4). The output signal of circuit 10 is applied to quadrature processing circuit 20, developing the signal $B(e^x + je^{-x})$, and the output signal of circuit 20 is applied to circuit 30 which doubles the frequency, limits, and appropriately filters the applied signal. From the above, it can be seen that the output signal of circuit 30 is the phase modulated signal $\cos(\omega t + \phi)$ where $\phi$ equals $\cos^{-1}[a(t)\cos \alpha t]$.

The signal $(\cos \omega t) e^{j2\alpha}$, which is the desired output signal of quadrature processing circuit 20, can be realized by employing two quadrature circuits (developing the signal $B[e^x + je^{-x}]$) in cascade and by limiting the output of the second quadrature hybrid. In such an embodiment, the two input signals of the first circuit are $\cos \omega t$ and $x$, yielding the signal $(e^x + je^{-x})\cos \omega t$, and the two input signals to the second circuit are the output signal of the first circuit and the signal $x$, yielding the signal $(e^x - e^{-x} + 2j)\cos \omega t$. Thus, the output signal of the second circuit comprises the carrier $\cos \omega t$, amplitude modulated by the signal $2\cosh x$ (the square root of $[e^x - e^{-x}]^2 + 4$) and phase modulated by an angle whose cosine equals $\tanh x$. Indeed, the phase modulation has the desired functional relationship.

Alternatively, the signal $(\cos \omega t)e^{j2\alpha}$ can be realized by employing a single quadrature processing circuit, with the output of the circuit being squared in a squaring device. The input signals to the single quadrature processing circuit are $x$ and $\cos(\omega t/2)$. Squaring produces the signal $\cos^2(\omega t/2)(e^x + je^{-x})^2$, which is equivalent to a dc component and a $\cos \omega t$ component, both phase shifted by the angle $2\alpha$ as discussed above.

Whether a double quadrature processing circuit is used or a single quadrature processing circuit in conjunction with squaring is used, in both cases the output signal is amplitude modulated (with a strictly positive signal) and should, therefore, be hard limited to insure a constant amplitude for the phase modulated signal. The constant amplitude is required for interferometric amplification. Fortuitously, since the hard limiting operation of diodes produces, among other effects, a squaring action, diode limiting may be employed to achieve both squaring and limiting, permitting thereby the use of a single quadrature processing circuit followed by a limiter. Although limiting produces additional harmonic distortion, such harmonics, unlike intermodulation products, can easily be filtered out. Thus, it is sufficient for circuit 20 to realize the function $\cos(\omega t/2)(e^x + je^{-x})$ and for circuit 30 to hard limit the output of circuit 20 and to filter the hard limited signal with an appropriately selected bandpass filter.

Having described the mathematical foundation and the general implementation of this invention, the following describes in detail a number of embodiments useful in realizing the structure of FIG. 1.

CIRCUIT 10

The development of a signal proportional to the hyperbolic arc-tangent of an input signal may, at first blush, appear difficult. In fact, the hyperbolic tangent is composed of exponential terms which naturally occur in electronic circuits and which, therefore, are not difficult to realize.

Figure 2:
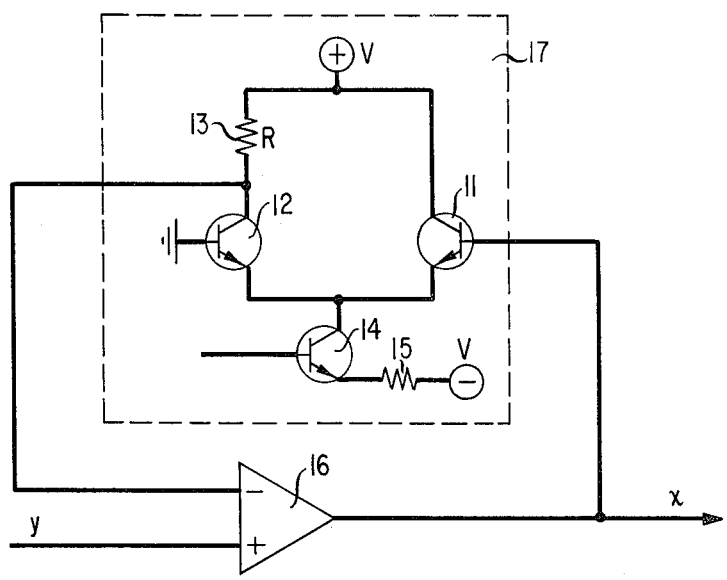
FIG. 2 details one embodiment for the inverse hyperbolic tangent circuit of FIG. 1 (circuit 10)

FIG. 2 depicts one embodiment of a $\tanh^{-1}$ function generator, constructed in accordance with the feedback principles described by Redman in U.S. Pat. No. 3,987,366, issued Oct. 19, 1976, with circuit 17, which develops the tanh function, being connected in a negative feedback fashion to differential amplifier 16. Circuit 17 comprises a current source composed of transistor 14 and resistor 15 connected to the emitter of transistor 14. The collector of transistor 14 is connected to the emitter leads of transistors 11 and 12, the base of transistor 12 is connected to ground potential and the base of transistor 11 comprises the input port of circuit 17. The collector of transistor 11 is connected to a positive potential, V, while the collector of transistor 12 is connected through resistor 13, of value $R_1$, to the same positive potential. The current $I_{12}$, flowing in the collector of transistor 12, is related to the current $I_{14}$ flowing in transistor 14 essentially by the expression $$I_{12} = I_{14}/(e^{\beta x} + 1) \qquad (5)$$

where $\beta$ represents the well known physical constant $q\lambda/kT$. The voltage at the collector of transistor 12, which is the output voltage of circuit 17, is $V - I_{14}R_1/(e^{\beta x} + 1)$. That voltage, it can be shown, is equal to $(V - I_{14}R_{13}) + (I_{14}R_{13}/2)\tanh(\beta x/2)$. Since the output voltage of circuit 17 must equal the input voltage $y$ of amplifier 16 in order to obtain the output signal $\tanh^{-1} \cdot [a(t)\cos \alpha t]$, the input signal to the circuit of FIG. 2 must be the input signal $a(t)\cos \alpha t$ multiplied by the factor $2/\beta$, and the output signal of amplifier 16 must be divided by the factor $I_{14}R_{\beta/2}$ and have the constant 2 subtracted therefrom.

The circuit of FIG. 2 contains feedback, and feedback generally slows down the circuit's operation and lowers its frequency response. The FIG. 2 circuit is quite fast, however, because the feedback path contains only a single differential amplifier stage and, unlike prior art circuits, contains no time storage elements. Still, a circuit without the use of feedback is preferable.

Figure 3:
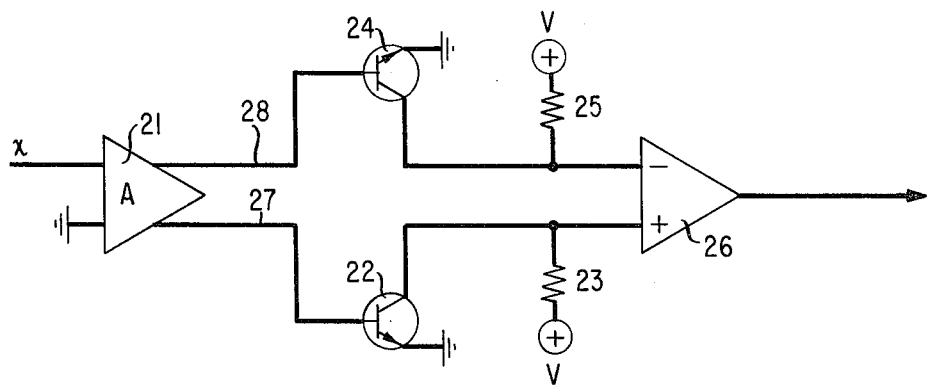
FIG. 3 details another embodiment for circuit 10 of FIG. 1.

FIG. 3 depicts a schematic diagram for a feedbackless circuit which approximates the $\tanh^{-1} x$ function. It does so by realizing the function $(1/F)\sinh(Fx)$, with the constant F selected to best approximate the function $\tanh^{-1} x$. It can be shown that the value $F = 1.95$ provides a fair approximation to the $\tanh^{-1}$ function. The circuit of FIG. 3 comprises a differential amplifier stage, an exponentiation stage, and a difference stage. The differential amplifier stage (21), which may be a Texas Instrument, Incorporated, integrated circuit SN7510, develops the signals $Ax$ and $-Ax$ at leads 27 and 28, respectively, where A is the gain of amplifier 21. The exponentiation stage comprises transistor 22 whose base is responsive to the signal of lead 27 and transistor 24 whose base is responsive to the signal of lead 28. The emitter leads of transistors 22 and 24 are connected to ground while the collectors of transistors 22 and 24 are connected through resistors 23 and 25, respectively, (both of value $R_2$) to positive potential V. The current through the collector lead of transistor 22 very closely approximates the signal $De^{\beta Ax}$ where D is a physical constant related to the structure of transistor 22. The voltage on the collector of transistor 22 is $V - R_2 De^{\beta Ax}$. Correspondingly the voltage on the collector lead of transistor 24 is $V - R_2 De^{-\beta Ax}$.

The difference stage comprises differential amplifier 26 whose positive input is connected to the collector terminal of transistor 22 and whose negative input is connected to the collector terminal of transistor 24. The output signal of amplifier 26 is $R_2D(e^{\beta Ax} - e^{-\beta Ax})$ which equals $2R_2D\sinh \beta Ax$. By setting $\beta A$ to the desired value F and $2R_2D$ to the desired value $1/F$, the approximation function $(1/F)\sinh(Fx)$ is realized.

CIRCUIT 20

Figure 4:
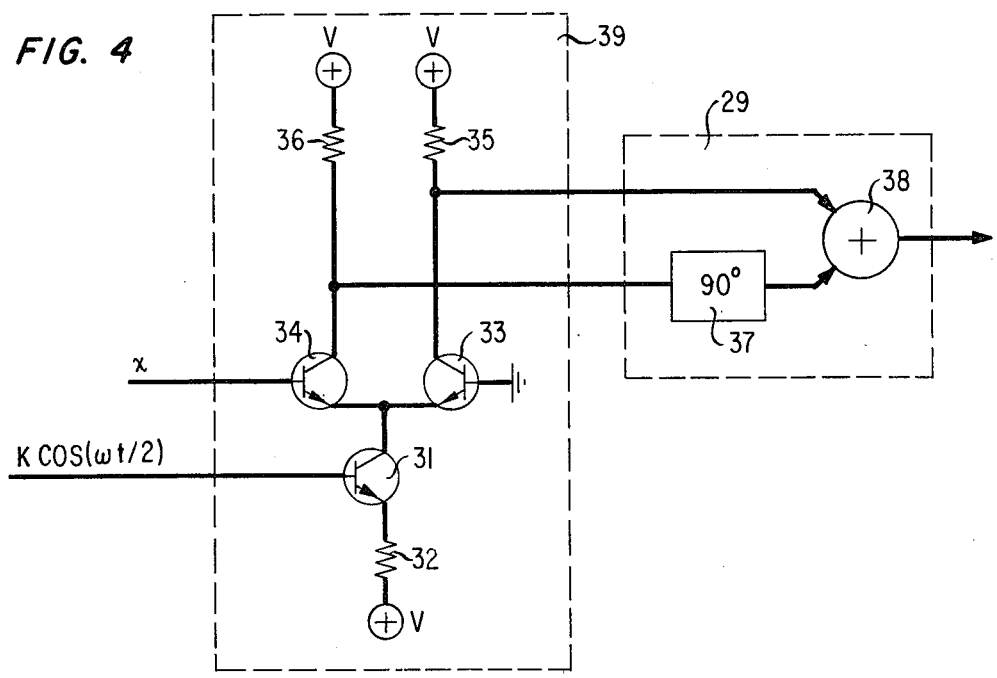
FIG. 4 depicts a schematic diagram of quadrature processing circuit 20 of FIG. 1.

The quadrature processing circuit develops the signal $B(e^x + je^{-x})$. The circuit illustrated in FIG. 4 develops this signal by employing an exponential amplification stage 39 followed by a quadrature summation stage 29. In exponential stage 39, transistors 33 and 34 have their emitters connected to a current source and their collectors connected to supply potential $+V$ through resistors 35 and 36 (having the values $R_3$), respectively. The current source comprises transistor 31 having its emitter connected to a negative potential through resistor 32 (of value $R_{32}$), its collector connected to the emitters of transistor 33 and 34 and its base being responsive to carrier signal $K\cos(\omega t/2)$. The current $I_{31}$ developed by the current source of transistor 31 is $(K/R_{32})\cos(\omega t/2)$. The base input of transistor 33 is connected to ground potential, while the base input of transistor 34 is responsive to signal $x$. It can be shown that the voltage at the collector terminal of transistor 34 is $V - R_3I_{31}e^{\beta x/2}/(e^{\beta x/2}+e^{-\beta x/2})$ while the voltage at the terminal of transistor 33 is $V - R^3I_{31}e^{-\beta x/2}/(e^{\beta x/2}+e^{-\beta x/2})$.

In quadrature summation stage 29 the voltage at the collector of transistor 34 is connected to a conventional 90 degree phase shifting network 37 and the output signal of network 37 is added to the collector voltage of transistor 33 in adder 38. The output voltage of adder 38 is $\{V - [I_{31}R_3/(e^{\beta x/2}+e^{-\beta x/2})]\}(e^{\beta x/2}+je^{-\beta x/2})$, or, $k(e^{\beta x/2}+je^{-\beta x/2})$ where $k$ is an amplitude modulation term dependent on V, $R_3$, $x$, and $I_{31}$ which in turn is dependent on K, $R_{32}$ and $\cos \omega t$. This voltage has the desired form except for the amplitude modulation term $k$, which is an undesirable term. Accordingly, the amplitude modulating term is eliminated in subsequent circuitry.

CIRCUIT 30

Circuit 30 provides hard limiting and filtering of the output signal of adder 38, which comprises the output signal of circuit 20. The hard limiting is achieved with a circuit branch, connected across the output of circuit 20 which includes a resistor in series of two back-to-back diodes. The desired constant amplitude output signal which appears across the diodes is applied to a conventional bandpass filter centered about frequency $\omega t$. The filter selects the desired second harmonic from the hard limited diodes' signal.

COMPLEMENTARY PHASE MODULATION

Figure 5:
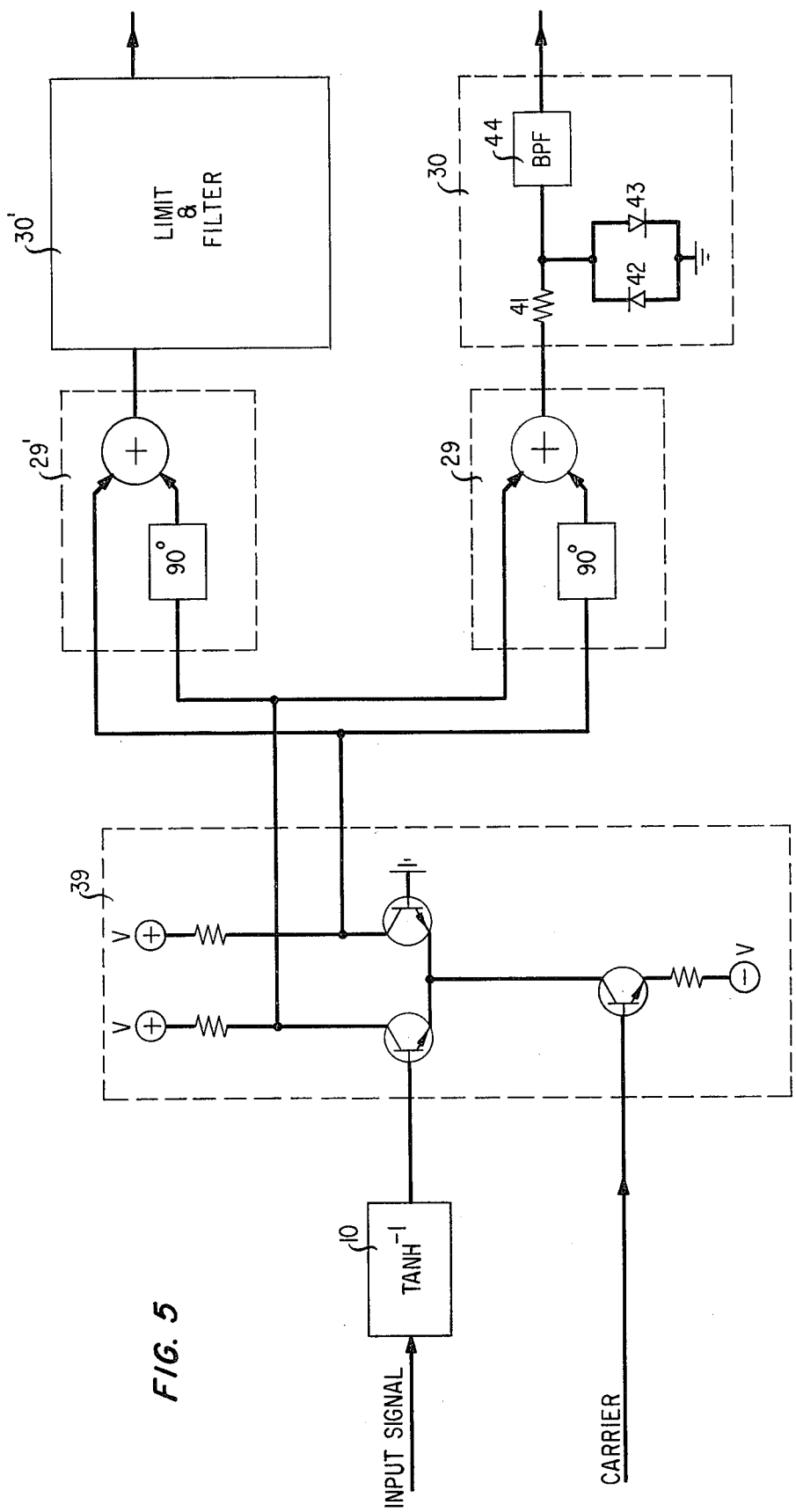
FIG. 5 illustrates the schematic diagram of a phase modulator developing simultaneously the phase modulated signal $\cos(\omega t + \phi)$ and $\cos(\omega t - \phi)$.

As indicated previously, the phase modulator of my copending application is required to develop the signals $\cos(\omega t + \phi)$ and $\cos(\omega t - \phi)$. FIG. 5 illustrates a schematic diagram of a modulator in accordance with the principles of this invention which develops the required signals rather economically. The economy is achieved by employing one $\tanh^{-1}$ circuit and one quadrature processing unit circuit for both signals. Thus, input signals are applied to $\tanh^{-1}$ circuit 10 and the output of circuit 10 is applied to exponential amplification circuit 39, as described in reference to the circuit of FIG. 4.

The output signals of circuit 39 are applied, as before, to circuit 29, developing thereby the signal $k(e^{\beta x/2}+\lambda je^{-\beta x/2})$. Additionally, the output signals of circuit 39 are applied to quadrature summation circuit 29' (identical to circuit 29), in transposed order, developing the signal $k(e^{-\beta x/2}+je^{\beta x/2})$.

The output signal of circuit 29 is applied to hard limiting and filter circuit 30 while the output signal of circuit 29' is applied to hard limiting and filter circuit 30' which is identical to circuit 30. Circuit 30, as described above, contains a resistor (41) in series of back-to-back diodes (42 and 43) connected across the output of circuit 29. The voltage developed across diodes 42 and 43 is applied to bandpass filter (44) which is tuned to frequency $\omega t$. While the output signal of circuit 30 is the desired phase modulated signal $\cos(Ct+\phi)$, the output signal of circuit 30' is the desired phase modulated signal $\cos(\omega t - \phi)$.

What is claimed is:

1. A phase modulator responsive to an input signal and to a carrier signal comprising:
   first means for developing a signal proportional to the inverse hyperbolic tangent of said input signal;
   second means, responsive to said first means and to said carrier signal for generating a signal which is proportional to a sum of two signals that are exponentially related to the output signal of said first means and which is amplitude modulated with said carrier signal; and
   third means for hard limiting the output signal of said second means.

2. A circuit for generating phase modulated signals responsive to a modulating input signal and to a carrier signal comprising:
   first means for developing a signal proportional to the inverse hyperbolic tangent of said input signal;
   second means, responsive to said first means and to said carrier signal, for generating a signal proportional to said carrier signal and to a sum of two signals which are exponentially related to the output signal of said first means;
   third means for hard limiting the output signal of said second means; and
   fourth means for filtering the output signal of said third means.

3. The circuit of claim 2 wherein said second means develops the signal $B(e^x+je^{-x})^2$, where $x$ is the output signal of said first means and B is said carrier signal.

4. The apparatus of claim 3 wherein said filter means is a bandpass filter generally centered at the frequency of said carrier signal.

5. The apparatus of claim 2 wherein said second means develops the signal $B(e^x+je^{-x})$ where $x$ is the output signal of said first means and B is said carrier signal.

6. The circuit of claim 5 wherein said filter is a bandpass filter generally centered about a frequency that is twice the frequency of said carrier.

7. The circuit of claim 2 wherein said first means approximates the inverse hyperbolic tangent function of said input signal, designated $x$, realizing the function $(1/F)\sinh Fx$, where F is a preselected constant.

8. The circuit of claim 2 wherein said second means comprises:
   a differential amplifier stage developing a first output signal proportional to said carrier signal and to an exponential term related to the output signal of said first means, and a second output signal proportional to said carrier signal and to an exponential term related to the negative of said output signal of said first means; and a quadrature summation stage developing a sum signal of said first output signal of said differential amplifier stage and 90° phase shifted replica of said second output signal of said differential amplifier stage.

9. A circuit for developing two signals which are phase modulated with respect to a carrier signal with equal but oppositely signed phase angles relating to the arc-cosine of an input signal comprising:

an inverse hyperbolic tangent circuit responsive to said input signal for developing a signal proportional to $\tanh^{-1}$ of said input signal;

a differential amplifier stage, responsive to the output signal of said inverse hyperbolic tangent circuit and to a carrier signal, for generating a first output signal proportional to said carrier signal and to an exponential term related to the output signal of said inverse hyperbolic tangent circuit, and for generating a second output signal proportional to said carrier signal and to an exponential term related to the negative of the output signal of said inverse hyperbolic tangent circuit;

first quadrature summation stage for developing a sum signal of said first output signal of said differential stage and a 90° phase shifted replica of said second output signal of said differential amplifier stage;

a second quadrature summation stage developing a sum signal of said second output signal of said differential amplifier stage and a 90° phase shifted replica of said first output signal of said differential amplifier stage;

means for hard limiting the output signals of said first and second quadrature summation stages; and means for filtering the output signals of said means for hard limiting.

10. The circuit of claim 9 further including means, interposed between said first and second quadrature summation stages and said means for hard limiting, for squaring the output signals of said first and second quadrature summation stages.

* * * * *